United States Patent
Someya

(10) Patent No.: US 8,428,531 B2
(45) Date of Patent: *Apr. 23, 2013

(54) RADIO WAVE RECEIVER

(75) Inventor: Kaoru Someya, Kiyose (JP)

(73) Assignee: Casio Computer Co., Ltd., Tokyo (JP)

( * ) Notice: Subject to any disclaimer, the term of this patent is extended or adjusted under 35 U.S.C. 154(b) by 60 days.

This patent is subject to a terminal disclaimer.

(21) Appl. No.: 12/774,099

(22) Filed: May 5, 2010

(65) Prior Publication Data

US 2010/0304698 A1 Dec. 2, 2010

(30) Foreign Application Priority Data

May 28, 2009 (JP) ................................. 2009-128431

(51) Int. Cl.
*H04B 1/18* (2006.01)
(52) U.S. Cl.
USPC ............... 455/193.1; 455/192.2; 455/192.3; 455/193.2; 455/182.2; 455/182.3; 375/222; 375/257
(58) Field of Classification Search .............. 455/192.1, 455/182.1–182.3, 191.1–191.3, 193.1–193.3, 455/192.2, 192.3; 375/222, 257
See application file for complete search history.

(56) References Cited

U.S. PATENT DOCUMENTS

| | | | |
|---|---|---|---|
| 4,100,578 A | 7/1978 | Arneson | |
| 4,326,220 A | 4/1982 | Mogi | |
| 4,864,639 A | 9/1989 | Dapore et al. | |
| 5,239,701 A | 8/1993 | Ishii | |
| 5,280,643 A | 1/1994 | Ishii | |
| 5,398,035 A | 3/1995 | Densmore et al. | |
| 5,521,651 A | 5/1996 | Matsui | |
| 5,722,060 A | 2/1998 | Horigome | |
| 6,177,846 B1 | 1/2001 | Takada et al. | |
| RE37,218 E | 6/2001 | Densmore et al. | |
| 6,389,272 B1 | 5/2002 | Horigome et al. | |
| 6,535,075 B2 | 3/2003 | Frech et al. | |

(Continued)

FOREIGN PATENT DOCUMENTS

| AU | 2008101062 A4 | 11/2008 |
|---|---|---|
| DE | 10 2004 037 637 A1 | 3/2006 |

(Continued)

OTHER PUBLICATIONS

UK Combined Search and Examination Report dated Sep. 24, 2010 (in English) in counterpart UK Application No. GB 1008928.2.

(Continued)

*Primary Examiner* — Junpeng Chen
(74) *Attorney, Agent, or Firm* — Holtz, Holtz, Goodman & Chick, P.C.

(57) ABSTRACT

A radio wave receiver including an antenna for receiving a radio wave; a tuning unit that can discretely changing a frequency characteristic of the antenna; an oscillation generator that can oscillate the antenna and a circuit portion of the tuning unit; a reception processing section for extracting a signal of a desired wave out of a reception signal received from the antenna; a controller for generating an oscillation signal at the circuit portion by the oscillation generator, and switching a setting of the tuning unit to search a setting state of the tuning unit under which the oscillation signal is extracted by the reception processing section; and a compensator for applying a variation to a frequency characteristic of the oscillation signal or a frequency characteristic associated with signal extraction of the reception processing section when the controller searches the setting state.

7 Claims, 7 Drawing Sheets

U.S. PATENT DOCUMENTS

| | | |
|---|---|---|
| 6,625,433 B1 | 9/2003 | Poirier et al. |
| 6,681,102 B1 * | 1/2004 | Collier et al. ............. 455/296 |
| 6,750,734 B2 * | 6/2004 | Utsunomiya et al. ........ 333/17.1 |
| 7,155,186 B2 | 12/2006 | Kasperkovitz |
| 7,187,913 B1 | 3/2007 | Rahn et al. |
| 7,227,916 B2 | 6/2007 | Ruelke et al. |
| 7,245,890 B2 | 7/2007 | Kumagawa et al. |
| 7,251,466 B2 | 7/2007 | Porret et al. |
| 7,299,018 B2 | 11/2007 | Van Rumpt |
| 7,463,870 B2 | 12/2008 | Peusens et al. |
| 7,583,942 B2 | 9/2009 | Ihara |
| 7,756,500 B1 | 7/2010 | Fulga et al. |
| 7,860,477 B2 | 12/2010 | Christ |
| 7,991,371 B2 | 8/2011 | Ishiguro |
| 8,131,237 B2 | 3/2012 | Someya |
| 2004/0137865 A1 | 7/2004 | Callias et al. |
| 2005/0153677 A1 | 7/2005 | Vorenkam et al. |
| 2006/0217094 A1 | 9/2006 | Ikeda et al. |
| 2007/0285255 A1 | 12/2007 | Tsushima et al. |
| 2007/0296593 A1 | 12/2007 | Hall et al. |
| 2008/0081583 A1 | 4/2008 | Zhang et al. |
| 2009/0176467 A1 | 7/2009 | Im et al. |
| 2010/0149430 A1 | 6/2010 | Fulga et al. |
| 2010/0149431 A1 | 6/2010 | Fulga et al. |
| 2010/0178888 A1 | 7/2010 | Nomura et al. |
| 2012/0129477 A1 | 5/2012 | Someya |

FOREIGN PATENT DOCUMENTS

| | | |
|---|---|---|
| EP | 1 865 445 A2 | 12/2007 |
| JP | 63-217830 A | 9/1988 |
| JP | 11-312959 A | 11/1999 |
| JP | 2000-231609 A | 8/2000 |
| JP | 2002-365384 A | 12/2002 |
| JP | 2003-332934 A | 11/2003 |
| JP | 2004-505485 A | 2/2004 |
| JP | 2006-246419 A | 9/2006 |
| JP | 2007-096381 A | 4/2007 |
| WO | WO 2004/105240 A1 | 12/2004 |

OTHER PUBLICATIONS

Japanese Office Action dated May 10, 2011 (and English translation thereof) in counterpart Japanese Application No. 2009-128431.
German Office Action dated Jul. 19, 2011 (and English translation thereof) in counterpart German Application No. 10 2010 028 886.1.
U.S. Appl. No. 12/486,212; First Named Inventor: Kaoru Someya; Title: "Radio Wave Receiving Apparatus"; filed Jun. 17, 2009.
U.S. Appl. No. 13/359,853; First Named Inventor: Kaoru Someya; Title: "Radio Wave Receiving Apparatus"; filed Jan. 27, 2012.
U.S. Appl. No. 12/652,850; First Named Inventor: Keiichi Nomura; Title: "Radio Wave Receiving Apparatus"; filed Jan. 6, 2010.

* cited by examiner

| RESOLUTION OF TUNING CIRCUIT | OSCILLATION FREQUENCY DISCRETE QUANTITY OF 40KHz BAND | OSCILLATION FREQUENCY DISCRETE QUANTITY OF 77.5KHz BAND | MAXIMUM TIME OF DETECTION (0.1s STEP) |
|---|---|---|---|
| 8bit | 156Hz | 302Hz | 25.6 SECOND |
| 9bit | 78.1Hz | 151Hz | 51.2 SECOND |
| 10bit | 39.0Hz | 75.5Hz | 102.4 SECOND |
| 11bit | 19.5Hz | 37.8Hz | 204.8 SECOND |
| 12bit | 9.75Hz | 19.8Hz | 409.6 SECOND |
| 13bit | 4.88Hz | 9.9Hz | 819.2 SECOND |

RADIO WAVE RECEIVER

CROSS-REFERENCE TO RELATED APPLICATIONS

This application is based on and claims the benefit of priority from the prior Japanese Patent Application No. 2009-128431 filed on May 28, 2009 including specification, claims, drawings and summary, the entire contents of which are incorporated herein by reference.

BACKGROUND OF THE INVENTION

1. Field of the Invention

The present invention relates to a radio wave receiver having an antenna and a tuning unit.

2. Description of Related Art

There has been hitherto proposed a communication device for turning the resonance frequency of an antenna to the frequency of a desired wave by varying the frequency characteristic of a tuning circuit connected to the antenna (for example JP-A-2000-231609 and JP-A-2003-332934).

The present invention has an object to provide a radio wave receiver that can adjust an antenna by using an oscillation signal generated at portions of the antenna and a tuning circuit, and detect a state that the resonance frequency of the antenna approaches to the frequency of a desired wave even when the adjustment interval of the tuning circuit is rough.

SUMMARY OF THE INVENTION

According to an aspect of the present invention, there is provided a radio wave receiver comprising: an antenna for receiving a radio wave; a tuning unit that can discretely changing a frequency characteristic of the antenna; an oscillation generator that can oscillate the antenna and a circuit portion of the tuning unit; a reception processing section for extracting a signal of a desired wave out of a reception signal received from the antenna; a controller for generating an oscillation signal at the circuit portion by the oscillation generator, and switching a setting of the tuning unit to search a setting state of the tuning unit under which the oscillation signal is extracted by the reception processing section; and a compensator for applying a variation to a frequency characteristic of the oscillation signal or a frequency characteristic associated with signal extraction of the reception processing section when the controller searches the setting state.

DESCRIPTION OF THE PREFERRED EMBODIMENT

Preferred embodiments according to the present invention will be described hereunder with reference to the accompanying drawings.

First Embodiment

Figure 1:
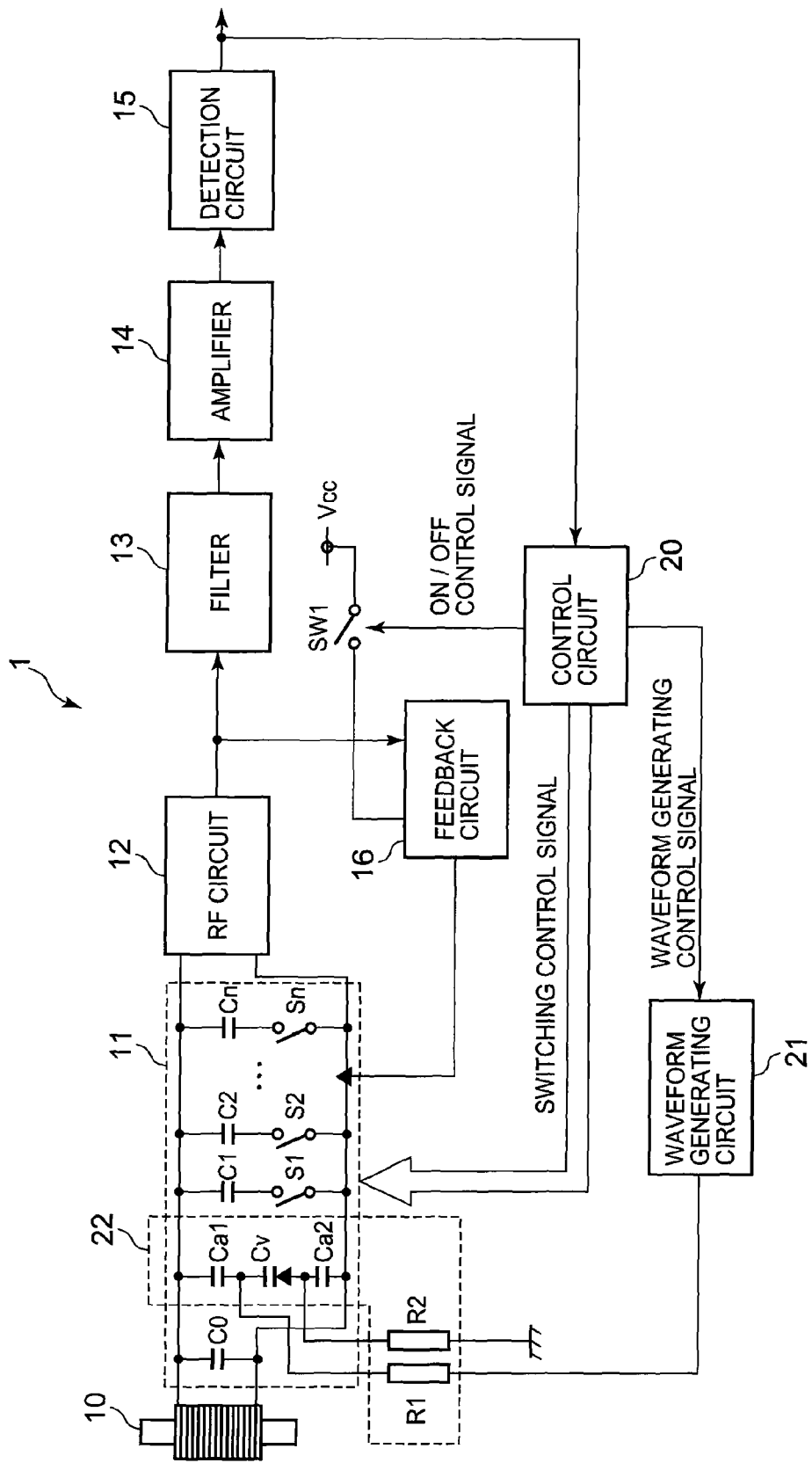
FIG. 1 is a diagram showing the overall construction of a radio wave receiver according to a first embodiment of the present invention.
Figure 2:
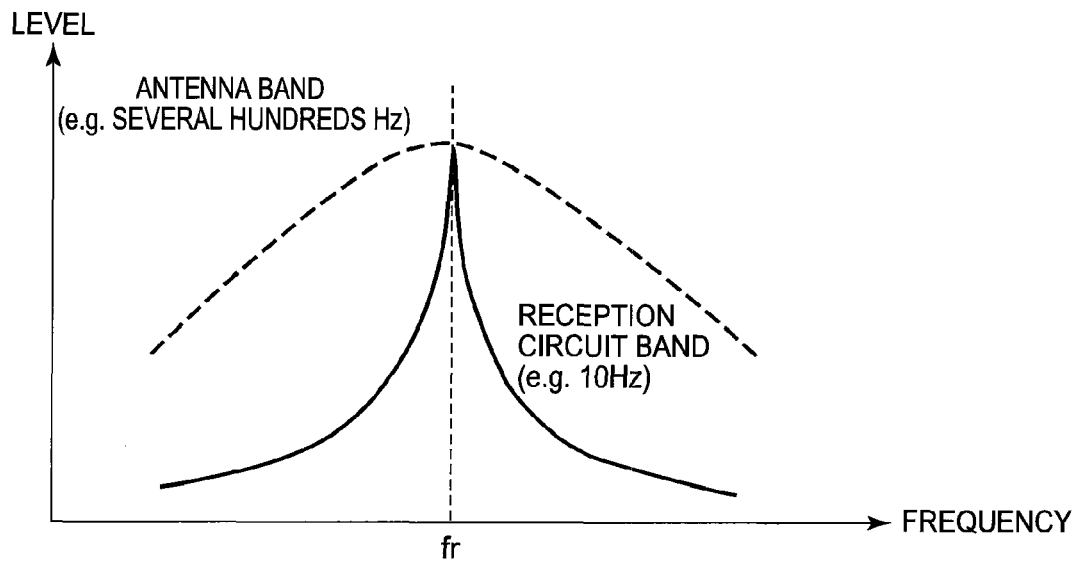
FIG. 2 is a graph showing a band characteristic of an antenna and a pass band characteristic of a reception circuit.

FIG. 1 is a diagram showing the overall construction of a radio wave receiver 1 according to a first embodiment of the present invention. FIG. 2 is a graph showing a band characteristic of an antenna 10 and a pass band characteristic of a reception circuit.

The radio wave receiver 1 according to this embodiment is a device for receiving a radio wave and executing demodulation processing of an information signal contained in a signal of a desired wave. Specifically, the radio wave receiver 1 is mounted in an electric timepiece and receives a standard radio wave containing a time code. This radio wave receiver 1 has an antenna 10 for receiving a radio wave, a tuning circuit (tuning unit) 11 for adjusting the frequency characteristic of the antenna 10, an RF circuit 12 for amplifying an RF signal received by the antenna 10 and removing noise, a filter 13 for extracting a frequency signal of a desired wave from the reception signal, an amplifier 14 for amplifying the extracted frequency signal of the desired wave, a detection circuit 15 for demodulating an output of the amplifier 14 and extracting an information signal, a feedback circuit 16 as an oscillation generator which can induce loop oscillation at the antenna 10 and the circuit portion of the tuning circuit 11 by feeding back an RF signal, a control circuit (controller) 20 for executing adjustment processing of the antenna 10, etc., a tuning capacitance compensating circuit 22 for making the tuning capacity continuously vary over a fixed range, a waveform generating circuit 21 as a signal generator for repetitively outputting a predetermined waveform signal to the tuning capacitance compensating circuit 22.

In the above construction, a reception processing section for extracting the signal of the desired wave and executing the signal processing is constructed by the filter 13, the amplifier 14 and the detection circuit 15, and a compensator for applying variation to the frequency characteristic of an oscillation signal is constructed by the tuning capacitance compensating circuit 22 and the waveform generating circuit 21.

The antenna 10 is a bar antenna constructed by winding a coil around a core. A monopole antenna, a dipole antenna or the like may be adopted in accordance with the reception frequency. The band characteristic of signals which can be received by the antenna 10 is substantially determined by the frequency characteristics of the antenna 10 and the tuning circuit 11. As indicated by a broken line of FIG. 2, the antenna 10 has such a frequency characteristic that the reception level has a peak for the signal having the same frequency as the resonance frequency fr, and the reception level is gradually reduced as the frequency is far away from the resonance frequency fr. The resonance frequency fr corresponds to the resonance frequency of a resonance circuit formed by coupling the inductance of the antenna 10 and the capacitance component of the tuning circuit 11. The signal band which can be received by the antenna 10 is relatively broad, for example, in the range of several hundreds Hz with the resonance frequency fr as the center of the range.

The tuning circuit 11 has a fixed tuning capacitor C0 connected to the antenna 10, a plurality of tuning capacitors C1 to Cn which can be connected to/disconnected from the antenna 10, switches S1 to Sn for switching the connection/disconnection of the tuning capacitors C1 to Cn, a varicap diode Cv as a variable reactance or a variable capacitor varying the capacitance value sequentially when the antenna is adjusted. The varicap diode Cv are connected to a signal line of the antenna 10 at both the terminals thereof through capacitors Ca1 and Ca2 for DC cut so that no DC current flows to the signal line when a control voltage is applied to the varicap diode Cv.

An RF circuit 12 contains an RF amplifier for amplifying a reception signal received through the antenna 10, and a noise removing filter.

The filter 13 passes a signal having the frequency of a desired wave from signals received through the antenna 10, and attenuates the signals of the other frequencies. The filter 13 is constructed by cascade-connecting a band pass filter, a low pass filter, etc. The band characteristic as the signals which can be received by the reception circuit (the filter 13, the amplifier 14, the detection circuit 15) is substantially the same as the pass band characteristic of the filter 13. As indicated by a solid line of FIG. 2, the pass band of the filter 13 is set to a very narrow band in which the half maximum full-width is equal to about 10 Hz with the frequency of the desired wave set at the center.

For example, the feedback circuit 16 contains an amplifier, and the output of the RF circuit 12 is amplified by the amplifier and fed back to the signal line of the tuning circuit 11 to thereby make an oscillating operation be executed in this feedback loop. The feedback circuit 16 is connected to the signal line through a coupling capacitor whose capacitance is set so that the frequency characteristics of the antenna 10 and the tuning circuit 11 are no affected, and the oscillation frequency of the feedback loop is substantially equal to the resonance frequency of the antenna (the resonance frequency of the resonance circuit formed by coupling the antenna 10 and the tuning circuit 11). For example, the feedback circuit 16 can be switched between an operation state and a non-operation state by turning on/off supply of a power supply voltage Vcc through a switch SW1.

The construction of the feedback circuit 16 may be variously modified. For example, the feedback destination of a signal passed through the feedback circuit 16 may be set to not only the signal line of the tuning circuit 11, but also signal line wound around the antenna 10. The output of the RF circuit 12 may be set as a differential signal, and the differential signal may be fed back to a pair of signal lines of the antenna 10 or the tuning circuit 11. Furthermore, an auxiliary winding which is electromagnetically coupled with the coil of the antenna 10 may be provided so that the signal is fed back to the auxiliary winding, or another antenna for transmitting may be provided so that the signal is fed back as a radio wave signal to the antenna 10. Still furthermore, the output of the RF circuit 12 may be directly fed back to the signal line of the antenna 10 or the tuning circuit 11 through a signal line for feedback without amplifying the signal in the feedback circuit 16. In this case, a switch element is provided to the feedback signal line in series, and ON/OFF control of the feedback operation can be performed by turning on or off the switch element.

In the tuning capacitance compensating circuit 22, the varicap diode Cv and the capacitors Ca1, Ca2 for DC cut are connected in series between the pair of signal lines of the tuning circuit 11, and a control voltage can be outputted from the waveform generating circuit 21 between both the terminals of the varicap diode Cv. Resistors R1 and R2 are inserted between the waveform generating circuit 21 and the varicap diode Cv so as to separate the tuning circuit 11 and the waveform generating circuit 21 in a high-frequency band The waveform generating circuit 21 functions as a characteristic changing unit, and continuously generates and outputs a signal of a sine wave, a triangular wave or a saw-tooth wave which has a predetermined amplitude, for example. The waveform generating circuit 21 is configured to be actuated or stopped on the basis of a waveform generating control signal from the control circuit 20.

The control circuit 20 contains CPU (central processing unit), ROM (Read Only Memory) for storing control programs executed by CPU and control data, RAM (Random Access Memory) for supplying a memory space for work to CPU, an AD converter for detecting the output level of the detection circuit 15, an I/O circuit for outputting various kinds of control signals, etc. The control programs stored in ROM contain a program for antenna automatic adjusting processing for searching a setting in which the resonance frequency of the antenna 10 approaches to the frequency of the desired wave by successively switching the setting of the tuning circuit 11 while monitoring the level of the demodulated output (the output level of the detection circuit 15).

First, a case where the antenna adjusting processing is executed without making the waveform generating circuit 21 and the tuning capacitance compensating circuit 22 take no action.

In the antenna adjusting processing, the control circuit 20 turns on the switch SW1 to actuate the feedback circuit 16, and induces loop oscillation in the route of the RF circuit 12, the feedback circuit 16 and the tuning circuit 11 to generate an oscillation signal. At this time, the inductance and capacitance components of the antenna 10 and the tuning circuit 11 predominate determination of the frequency of the loop oscillation, and the frequency of the oscillation signal is substantially equal to the resonance frequency of the antenna 10 (the resonance frequency of the resonance circuit formed by coupling the antenna 10 and the tuning circuit 11).

Under this state, the control circuit 20 switches the switches S1 to Sn of the tuning circuit 11 step by step through a switching control signal. The magnitude of the tuning capacitance varies discretely by switching the setting state of the tuning circuit 11, and thus in connection with this discrete variation, the frequency of the oscillation signal is discretely varying.

Figure 3:
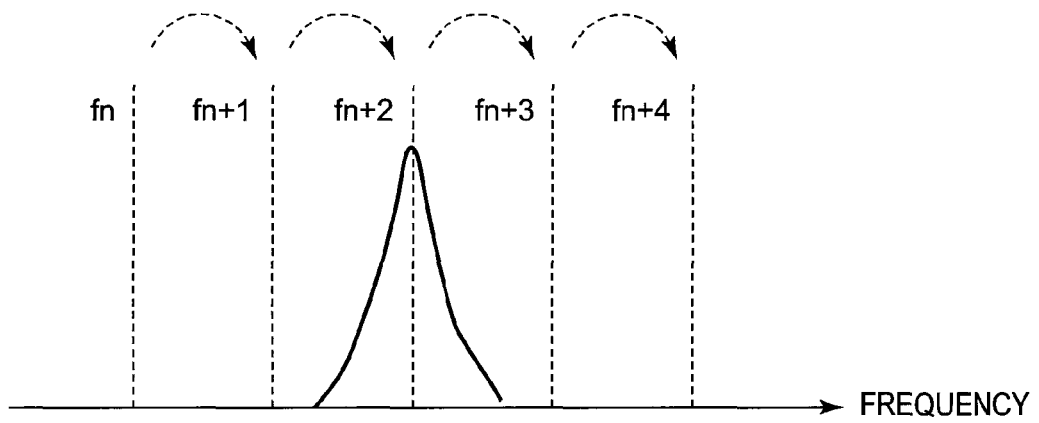
FIG. 3 is a characteristic diagram showing a first example of the relationship between the transition of the frequency of an oscillation signal based on switching of the setting of a tuning circuit and the pass band of the reception circuit.
Figures 4, 5:
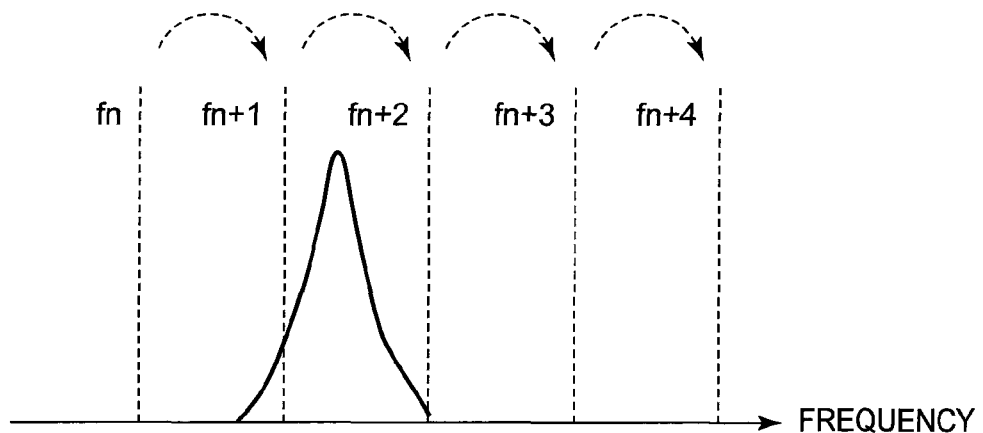
FIG. 4 is a characteristic diagram showing a second example of the relationship between the transition of the frequency of the oscillation signal based on the switching of the setting of the tuning circuit and the pass band of the reception circuit.
FIG. 5 is a table showing the relationship of the resolution of the tuning circuit, the discrete quantities of the oscillation frequencies of two frequency bands and the maximum time for detecting the tuning setting.

FIGS. 3 and 4 are characteristic diagrams showing first and second examples each of which shows the relationship between the transition of the frequency of the oscillation signal based on the switching of the setting of the tuning circuit 11 and the pass band of the reception circuit. In FIGS. 3 and 4, a dashed line represents the oscillation signal, and a solid line represents the band characteristic of the reception circuit (the pass band characteristic of the filter 13).

As shown in FIGS. 3 and 4, the frequency of each oscillation signal hardly spreads, and it is substantially equal to the resonance frequency of the antenna 10. Furthermore, the frequency of the oscillation signal varies discretely by switching the switches S1 to Sn of the tuning circuit 11. For example, the frequency of the oscillation signal is discretely varying like fn, fn+1, fn+2, fn+3, fn+4, . . . .

Accordingly, as shown in FIG. 3, when any one of the frequencies of fn, fn+1, fn+2, fn+3, fn+4, . . . of the oscillation signals varying discretely (for example, the frequency fn+2) is overlapped with the pass band of the reception circuit substantially at the center thereof, this oscillation signal is sent to the filter 13, the amplifier 14 and the detection circuit 15 and then detected as the level increase of the demodulated output by the control circuit 20.

On the other hand, as shown in FIG. 4, when the frequencies fn, fn+1, fn+2, fn+3, fn+4, . . . of the oscillation signals varying discretely greatly stride over the pass band of the reception circuit and thus the frequencies are not overlapped with the pass band concerned in a near range, all the oscillation signals are not sent to the filter 13, the amplifier 14 and the detection circuit 15, and thus they are not detected as the level increase of the demodulated output by the control circuit 20. Therefore, there occurs a problem that it is difficult to perform the adjustment processing for approaching the resonance frequency of the antenna 10 to the frequency of the desired wave is difficult.

Such a problem can be solved by increasing the resolution (the variable step number of the capacitance value) of the tuning circuit 11 to reduce the minimum variable amount of the capacitance value because the discrete quantity of the oscillation frequencies fn, fn+1, fn+2, fn+3, fn+4, . . . is reduced.

FIG. 5 is a diagram showing the relationship between the resolution of the tuning circuit, the discrete quantities of the oscillation frequencies in the two frequency bands and the maximum time for detecting the tuning setting.

For example, when the tuning capacitor of the tuning circuit 11 is configured to be linearly variable with a resolution of predetermined bits and the resonance frequency of the antenna 10 can be adjusted to reception channels of 40 kHz band and 77.5 kHz band, as indicated on the second line of the table of FIG. 5, in the case of the tuning capacitance resolution of 8 bits, the discrete quantity of the oscillation frequency in the neighborhood of the 40 kHz band is equal to 156 Hz, and the discrete quantity of the oscillation frequency in the neighborhood of 77.5 kHz band is equal to 302 Hz (i.e., these quantities are large values). In order to reduce the discrete quantities of the oscillation frequencies to the pass band width of the filter 13 (10 Hz) or less, it is necessary to set the resolution of the tuning capacitor to 13 bits as indicated on the last line of the table of FIG. 5.

Some degree of delay occurs for the oscillation signal passing through the reception circuit and the level of the demodulated output increased. In a case where one-step switching of the tuning circuit 11 is executed at a time interval of 0.1 second to compensate for above delay, as shown in the table of FIG. 5, when the resolution of the tuning circuit 11 is equal to 8 bits, a maximum time taken to execute the switching of all the steps of the tuning circuit 11 and detect the increase of the signal level is equal to 25.6 second. When the resolution of the tuning circuit 11 is equal to 13 bits, the maximum detection time is very long and it is equal to 819.2 seconds.

The respective values of the table of FIG. 5 are calculated on a condition that the inductance of the antenna 10 is set to 20 mH, a variation width of the tuning capacitance is set so that the resonance frequency of the antenna 10 can be adjusted to the 40 kHz band and the 77.5 kHz band even when an error of about 10% occurs in the inductance value of the antenna 10 or the capacitance value of the tuning circuit 11 and the variable width is changeable with a resolution of predetermined bits by the tuning circuit 11. The resonance frequency of the antenna 10 is proportional to the reciprocal number of the square root of the tuning capacitance. Therefore, even when the tuning capacitance is switched with a uniform resolution, the discrete quantity of the resonance frequency of the antenna 10 is not fixed, but varies in accordance with the frequency band thereof. For example, when the inductance of the antenna 10 is set to 20 mH, the variation of the tuning capacitance 1 pF is varied between the 77.5 kHz band and the 40 kHz band as follows.

| Tuning capacitance 211 pF: | resonance frequency 77.515 kHz |
|---|---|
| 212 pF: | 77.332 kHz (−183 Hz) |
| Turning capacitance 792 pF: | resonance frequency 40.010 kHz |
| 793 pF: | 39.984 kHz (−26 Hz) |

As described above, by increasing the resolution of the tuning circuit 11, the discrete quantity of the oscillation frequency is reduced and any oscillation signal is overlapped with the pass band of the reception circuit, so that it can be detected as an increase of the demodulated output level. However, when the resolution of the tuning circuit 11 is increased, there occurs a drawback that the circuit area of the tuning circuit 11 also increases and the time required for the antenna adjusting processing is very long.

Therefore, according to the radio wave receiver 1, the above problem is solved not by increasing the resolution of the tuning circuit 11, but by utilizing the actions of the tuning capacitance compensating circuit 22 and the waveform generating circuit 21.

Next, the antenna adjusting processing of the radio wave receiver 1 according to this embodiment will be described.

When the antenna adjusting processing of this embodiment is started, the control circuit 20 turns on the switch SW1 to actuate the feedback circuit 16, and further actuates the waveform generating circuit 21 on the basis of a waveform generating control signal. Accordingly, an oscillation signal occurs at the antenna 10 and the circuit portion of the tuning circuit 11, and also a control voltage varying with a predetermined amplitude is output from the waveform generating circuit 21 to both the terminals of the varicap diode Cv. Then, on the basis of the control voltage, the capacitance value of the varicap diode Cv continuously varies in at least one variation direction with a predetermined variation amount with a predetermined period.

Here, the capacitors Ca1, Ca2 for DC cut are set to have larger capacitance values than that of the varicap diode Cv, and thus the capacitance variation of the varicap diode Cv directly acts as variation of the whole capacitance value of the tuning circuit 11. Furthermore, the capacitance variation amount of the varicap diode Cv is controlled to be equal to the same level as the variation amount of the minimum step based on the tuning capacitors C1 to Cn which can be switched by the switches S1 to Sn.

Under the control described above, the frequency of the oscillation signal occurring at the antenna 10 and the circuit portion of the tuning circuit 11 is varied at a predetermined period in connection with the variation of the tuning capacitance. Furthermore, the variation amount of the oscillation frequency is set to substantially the same level as the discrete quantity of the oscillation frequency which is stepwise switched by switches the switches S1 to Sn.

Under the operation state described above, the control circuit 20 switches the switches S1 to Sn of the tuning circuit 11 so that the tuning capacitance of the tuning circuit 11 is switched from a larger value to a smaller value every minimum step, for example. In this case, as shown in FIG. 4, the oscillation signal discretely shifts the frequency thereof like fn, fn+1, fn+2, fn+3, fn+4, ... when there is no action of the varicap diode Cv. However, under the action of the varicap diode Cv, the frequency band of the oscillation signal successively shifts to the frequencies of fn, fn+1, fn+2, fn+3, fn+4, etc. while the frequency thereof varies (increases or returns) at a predetermined period with the same level variation width as the respective discrete quantities of the frequencies fn, fn+1, fn+2, fn+3, fn+4, etc.

Therefore, for example, when the frequency of the oscillation signal is switched to the frequency fn+1 (FIG. 4) by switching the switches S1 to Sn, there occurs a period for which the oscillation frequency is overlapped with the pass band of the reception circuit due to the frequency variation. Accordingly, during this period, the oscillation signal is sent to the filter 13, the amplifier 14 and the detection circuit 15, and detected as an increase in level of the demodulated output by the control circuit 20.

The filter 13 has a delay characteristic. Therefore, in a case where the period for which the frequency of the oscillation signal is overlapped with the pass band of the filter 13 is short, waveform deterioration occurs in the oscillation signal when the oscillation signal passes through the filter 13. However, the oscillation signal is subsequently amplified by the amplifier 14, and demodulated by the detection circuit 15, whereby the oscillation signal can be detected as a fixed increase in level of the demodulated signal by the control circuit 20.

When detecting the level increase of the demodulated signal, the control circuit 20 stores the switching state of the switches S1 to Sn of the tuning circuit 11 at that time as a proper setting state of the tuning circuit 11 at the reception time of a radio wave. Alternatively, the switches S1 to Sn of the tuning circuit 11 are successively switched to determine a switching state of the tuning circuit 11 under which the level of the demodulated signal is peak, and stores this state as a proper setting state of the tuning circuit 11 as the reception time of a radio wave.

When the proper setting state of the tuning circuit 11 is determined, the control circuit 20 turns off the switch SW1 to set the feedback circuit 16 to an inactive state, sets the waveform generating circuit 21 to an inactive state on the basis of a waveform generating control signal, and then finishes this antenna adjusting processing.

when radio waves of a plurality of reception channels (for example, 40 kHz or 77.5 kHz) can be received by switching the characteristic of the pass band of the filter 13, the setting state of the tuning circuit 11 which is suitable for each of the plurality of reception channels can be determined by executing the antenna adjusting processing every reception channel.

At the reception time of the radio wave, the control circuit 20 reads out the setting state determined through the antenna adjusting processing, and switches the tuning circuit 11 to the setting state concerned. At this time, the feedback circuit 16 and the waveform generating circuit 21 are kept to be inactive. Accordingly, the resonance frequency of the antenna 10 approaches to the frequency of the desired wave by the setting state of the tuning circuit 11 described above, so that the radio wave having the frequency of the desired wave can be received with high reception sensitivity.

As described above, according to the radio wave receiver 1, when the antenna adjustment processing is executed, the frequency of the oscillation signal occurring at the antenna 10 and the circuit portion of the tuning circuit 11 is properly varied by the action of the waveform generating circuit 21 and the tuning capacity compensating circuit 22. Accordingly, even in a case where the capacitance adjusting amount of the tuning circuit 11 is designed to be relatively rough, the variation of the oscillation frequency described above is given during a term in which the resonance frequency of the antenna approaches to the pass band of the reception circuit by the stepwise switching of the tuning capacitance. Accordingly, there occurs a period for which the frequency of the oscillation signal is overlapped with the pass band of the reception circuit and thus the oscillation signal passes through the filter 13. This passage of the oscillation signal is detected as the level increase of the demodulated output, whereby the setting of the tuning circuit 11 which makes the resonance frequency of the antenna approach to the frequency of the desired wave can be determined.

Furthermore, even when the capacitance adjusting amount of the tuning circuit 11 is designed to be relatively rough, the antenna adjusting processing can be performed, so that it is unnecessary to increase the resolution of the tuning circuit 11 needlessly, the circuit area of the tuning circuit 11 can be reduced and the time required for the antenna adjusting processing can be shortened.

Still furthermore, the capacitance variation of the varicap diode Cv disposed in parallel to the tuning capacitors of the tuning circuit 11 is utilized to vary the frequency of the oscillation signal. Therefore, even when the capacitance variation width of the varicap diode Cv is fixed in the range from a higher frequency band to a low frequency band, the variation width of the oscillation frequency corresponding to the discrete quantity of the oscillation frequency based on the stepwise capacitance variation of the tuning circuit 11 can be given.

The tuning capacitance compensating circuit 22 having the varicap diode Cv, and the waveform generating circuit 21 for repetitively outputting the control voltage having a predetermined amplitude to the varicap diode Cv are merely added in order to vary the frequency of the oscillation signal, so that the construction of varying the frequency of the oscillation signal can be implemented with low cost.

In the above embodiment, the continuous variation width of the tuning capacitance by the varicap diode Cv is controlled to be the same level as the minimum capacitance variation which can be stepwise switched by the tuning capacitors C1 to Cn. However, this continuous variation width of the capacitance can be properly changed if the oscillation frequency can be controlled to be overlapped with the pass band of the reception circuit on the basis of the continuous tuning capacitance variation by setting the continuous variation width of the tuning capacitance to half or double of the minimum capacitance variation amount.

Furthermore, in the first embodiment, the construction of varying the oscillation frequency is applied to the straight type reception circuit (straight receiver). However, the same action and effect can be obtained by adding the construction of varying the oscillation frequency likewise to a super-heterodyne type or direct conversion type reception circuit.

Second Embodiment

Figure 6:
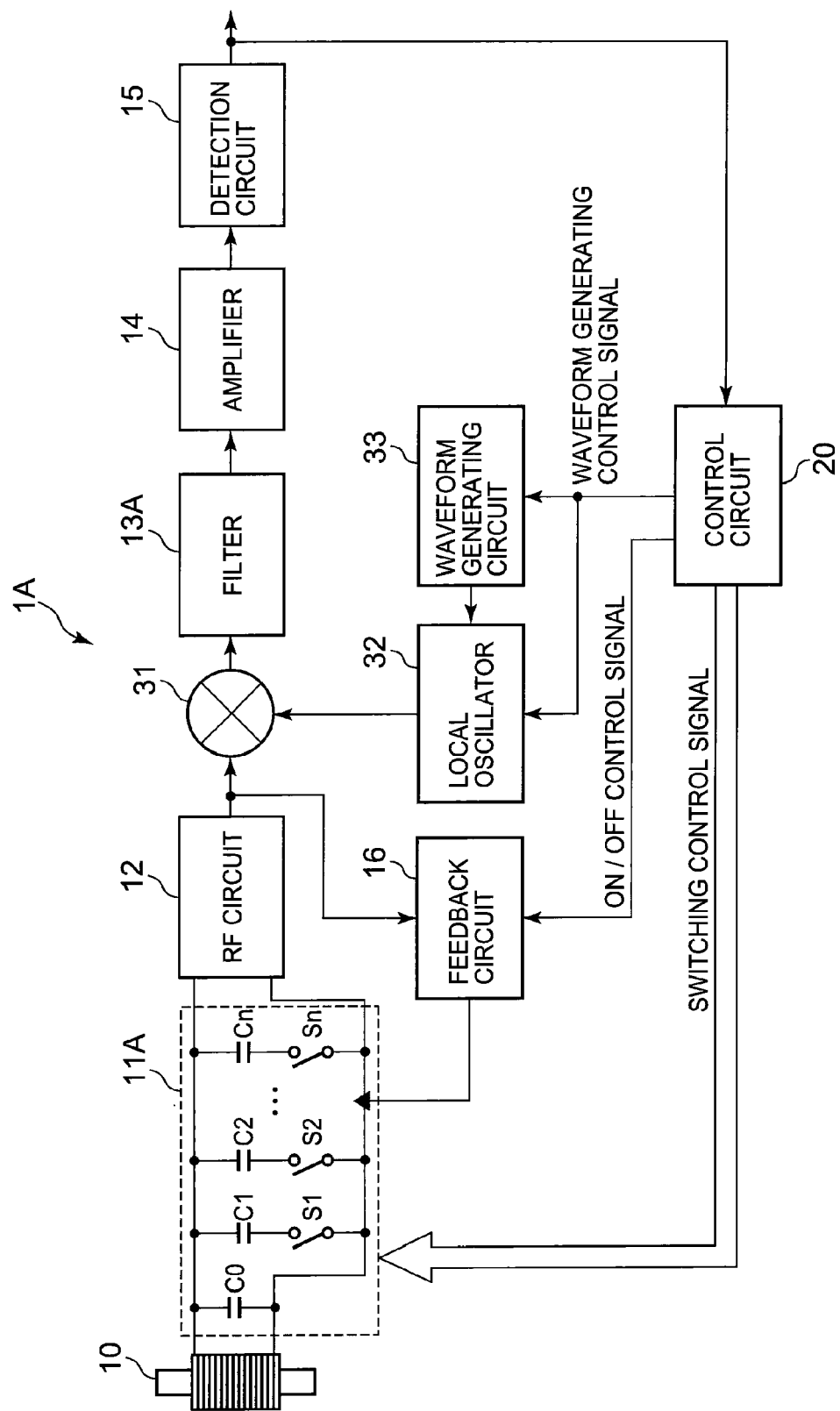
FIG. 6 is a diagram showing the overall construction of a radio wave receiver according to a second embodiment according to the present invention.
Figure 7:
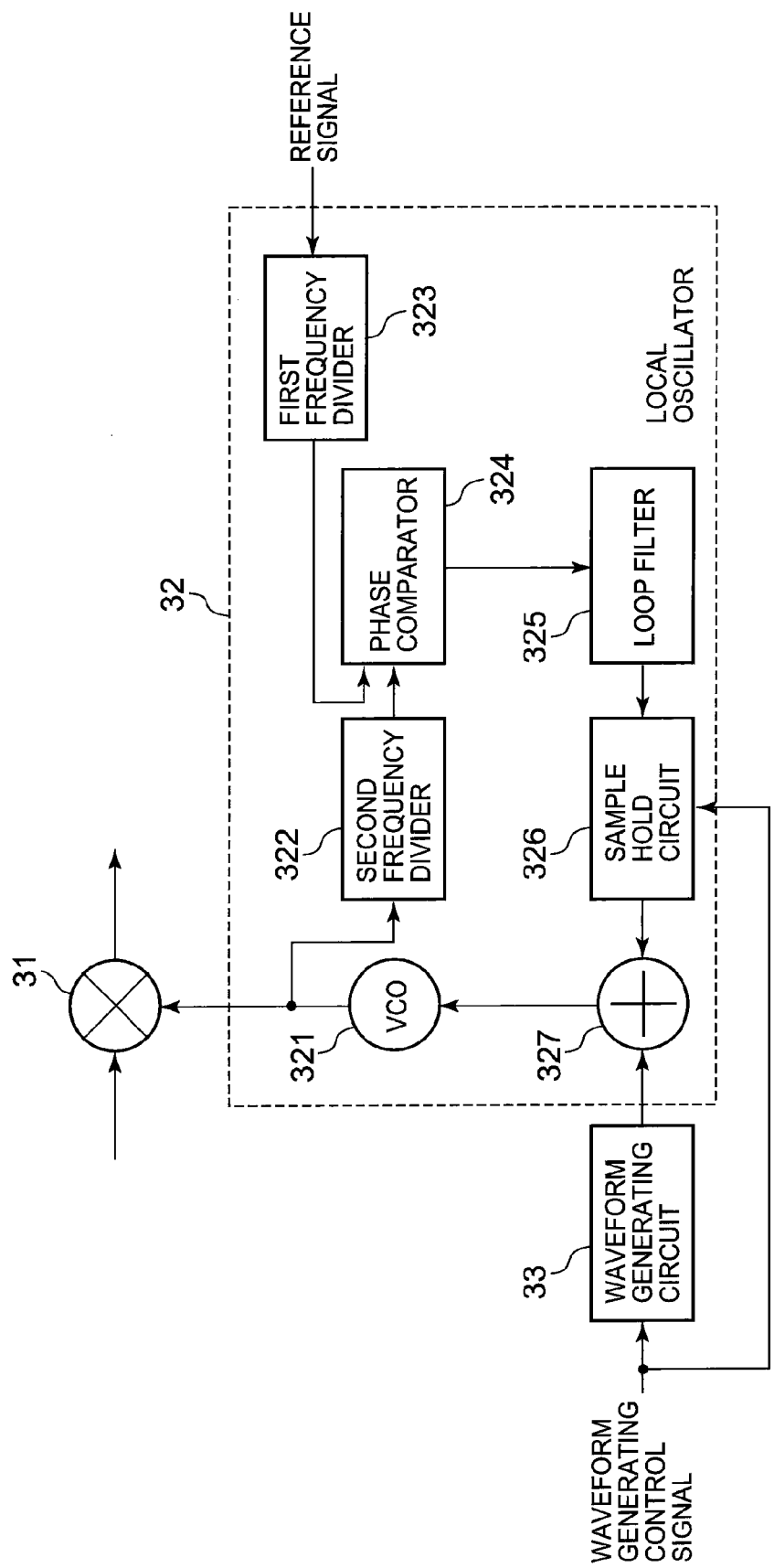
FIG. 7 is a circuit block diagram showing the details of a local oscillator of FIG. 6.

FIG. 6 is a diagram showing the overall construction of a radio wave receiver 1A according to a second embodiment, and FIG. 7 is a circuit block diagram showing the details of a local oscillator 32.

The radio wave receiver 1A according to the second embodiment applies variation of the frequency conversion amount of a mixer 31 in the antenna adjusting processing, whereby the antenna adjusting processing can be performed even when the frequency of the oscillation signal is switched at intervals. The same constituent elements as the first embodiment are represented by the same reference numerals, and the description thereof is omitted.

The radio wave receiver 1A is a super-heterodyne type, and it has an antenna 10 for receiving a radio wave, a tuning circuit 11A for adjusting the frequency characteristic of the antenna 10, an RF circuit 12 for amplifying a reception signal and removing noise, a mixer 31 as a frequency converter for converting a signal of a desired wave in the reception signal to a signal having a predetermined intermediate frequency, a band-pass filter 13A for extracting the signal of the intermediate frequency, an amplifier 14 for amplifying the extracted signal of the intermediate frequency, a detection circuit 15 for demodulating the amplified signal, a feedback circuit 16 for generating an oscillation signal at the antenna 10 and the circuit portion of the tuning circuit 11A, a local oscillator 32 for supplying the mixer 31 with an oscillation signal of a local frequency (hereinafter referred to as local oscillation signal), a waveform generating circuit 33 as a signal generator for applying variation to the frequency conversion amount based on the mixer 31, and a control circuit 20 for controlling the antenna adjusting processing, etc.

In the above construction, a reception processing section for extracting the signal of the desired wave and performing signal processing on the extracted signal is constructed by the mixer 31, the band-pass filter 13A, the amplifier 14 and the detection circuit 15, and a compensator for applying variation to the frequency characteristic of the signal extraction of the signal processing section is constituted by the local oscillator 32 and the waveform generating circuit 33.

FIG. 7 is a circuit block diagram showing the details of the local oscillator 32.

Since the frequency signal of the desired wave is converted to a signal having a predetermined intermediate frequency by the mixer 31, the local oscillator 32 generates a local oscillation signal having the frequency corresponding to the difference between both the frequencies, and supplies the generated local oscillation signal to the mixer 31. This local oscillator 32 can generate local oscillation signals of a plurality of frequencies which respectively correspond to a plurality of reception channels, for example.

The local oscillator 32 is designed so that a construction which can apply a frequency variation is added to a frequency-variable type PLL (Phase Locked Loop) circuit. As shown in FIG. 7, the local oscillator 32 comprises a VCO (voltage controlled oscillator) 321 for varying the oscillation frequency by voltage control, a second frequency divider 322 for frequency-dividing the signal for VCO 321, a first frequency divider 323 for frequency-dividing a signal of a reference frequency, a phase comparator 324 for comparing the phase of the signal of the first frequency divider 323 with the phase of the signal of the second frequency divider 322 and outputting a signal representing the difference between the phases, a loop filter 325 for subjecting the output of the phase comparator 324 to integration processing and removing AC components, a sample hold circuit 326 which can hold the output of the loop filter 325 under the control of the control circuit 20, an adder 327 for adding the output voltage of the sample hold circuit 326 and the output voltage of the waveform generating circuit 33 and outputting the addition result to VCO 321, etc.

When the waveform generating control signal of the control circuit 20 is invalidated in the normal reception processing or the like, the local oscillator 32 is not supplied with any output voltage from the waveform generating circuit 33, and the sample hold circuit 326 is set to a state that it does not hold the signal, but directly outputs the output of the loop filter 325. Accordingly, the local oscillator 32 operates as a normal PLL circuit, and outputs a signal having a frequency to which the frequency of the reference signal is changed on the basis of the frequency-division ratio of the first frequency divider 323 and the second frequency divider 322. The frequency division ratio of the first frequency divider 323 and the frequency division ratio of the second frequency divider 322 are set to be changeable under the control of the control circuit. By switching these frequency division ratios, the local oscillation signals of the plurality of frequencies corresponding to the a plurality of reception channels can be generated.

On the other hand, when the waveform generating control signal of the control circuit 20 is validated, the sample hold circuit 326 is set to a state that it holds the output of the loop filter 325 and outputs the thus-held signal to the adder 327. Furthermore, a voltage signal which continuously varies with a predetermined amplitude is outputted from the waveform generating circuit 33, the voltages of these signals are added to each other by the adder 327, and the addition voltage signal is output to VCO 321. The output of the waveform generating circuit 33 is a voltage signal varying continuously in at least one direction with a predetermined amplitude, such as a sine wave, a triangular wave, a saw-tooth wave or the like.

Through the circuit operation as described above, the output of the local oscillator 32 becomes a local oscillation signal obtained by adding the signal of the predetermined local frequency corresponding to the reception channel with the frequency variation continuously varying with a predetermined amplitude.

According to the radio wave receiver 1A of this embodiment, when the antenna adjusting processing is executed, the control circuit 20 sets the feedback circuit 16 to the operation state to generate the oscillation signal at the portion of the antenna 10 and the tuning circuit 11A. Furthermore, by generating the local oscillation signal corresponding to the reception channel at the local oscillator 32 and validating the waveform generating control signal, the continuous frequency variation having the predetermined amplitude is applied to the local oscillation signal.

Under this state, the control circuit 20 switches the setting of the tuning circuit 11A, and discretely changes the resonance frequency of the antenna 10. At this time, the oscillation signal generated at the portion of the antenna 10 and the tuning circuit 11A is subjected to frequency conversion by the mixer 31, however, the frequency variation described above is applied to the local oscillation signal. Therefore, the oscillation signal which has been subjected to frequency conversion by the mixer 31 is spread in frequency by only the amount corresponding to the frequency variation.

Accordingly, as shown in FIG. 4, even when the oscillation signal discretely shifts the frequency like fn, fn+1, fn+2, fn+3, fn+4, etc. and is hardly overlapped with the pass band of the reception circuit (into which the pass band of the filter 13A is converted as the pass band for the signal before the frequency conversion), these oscillation signals are spread in frequency when they are subjected to frequency conversion in the mixer 31. Therefore, when the frequency of the oscillation signal is equal to the frequency of fn+1 in FIG. 4, the oscillation signal passes through the filter 13A, and it is detected as the level increase of the demodulated output by the control circuit 20.

On the basis of the detection of the level increase of the demodulated output, the control circuit 20 can determine the proper setting state of the tuning circuit 11A at the reception time of the radio wave.

As described above, according to the radio wave receiver 1A of this embodiment, the oscillation signal generated at the portion of the antenna 10 and the tuning circuit 11A can be spread in frequency by the actions of the waveform generating circuit 33 and the frequency-variable local oscillator 32 in the antenna adjusting processing. Accordingly, even in a case where the capacitance adjusting amount of the tuning circuit 11A is designed to be relatively rough, a part of an oscillation signal passes through the filter 13A because the oscillation signal is spread in frequency when the resonance frequency of the antenna approaches to the frequency of the desired wave by stepwise switching the tuning capacitance. The passage of the part of the oscillation signal is detected as the level increase of the demodulated output, whereby the setting of the tuning circuit 11A which make the resonance frequency of the antenna approach to the frequency of the desired wave can be determined.

Furthermore, the construction of varying the frequency conversion amount of mixer 31 is adopted to spread the oscillation signal in frequency, and thus the oscillation signal can be spread in frequency by adding only a little circuit construction in the super-heterodyne type reception circuit construction. Furthermore, a circuit for applying variation to the frequency characteristic is not connected to a signal passage through which the reception signal passes in the normal radio wave reception processing, and thus the reception signal is not affected in the normal reception processing.

In the second embodiment, the output amplitude of the waveform generating circuit 33 is controlled to have such magnitude that the following action is obtained as follows. That is, even in a case where the pass band of the reception circuit is overlapped with a valley of the resonance frequency of the antenna 10 which shifts with skipping by switching of the tuning circuit 11A, a part of the oscillation signal can pass through the filter 13A when the resonance frequency of the antenna 10 is set to be near to the pass band of the reception circuit by the frequency variation of the mixer 31.

When the discrete degree of the resonance frequency of the antenna shifts at a large amount in a high frequency range and also shifts at a small amount in a low frequency range due to the switching of the tuning circuit 11A, the switching control of the tuning circuit 11A may be synchronized with the control of the waveform generating circuit 33, and the waveform generating circuit 33 may be controlled so that the output amplitude thereof is increased in the high resonance frequency range of the antenna 10 and also reduced in the low resonance frequency range of the antenna 10.

Furthermore, according to this embodiment, the frequency characteristic of the mixer 31 is varied with respect to the super-heterodyne type reception circuit. However, the same action can be obtained by applying the same construction to the direct conversion type reception circuit.

Third Embodiment

Figure 8:
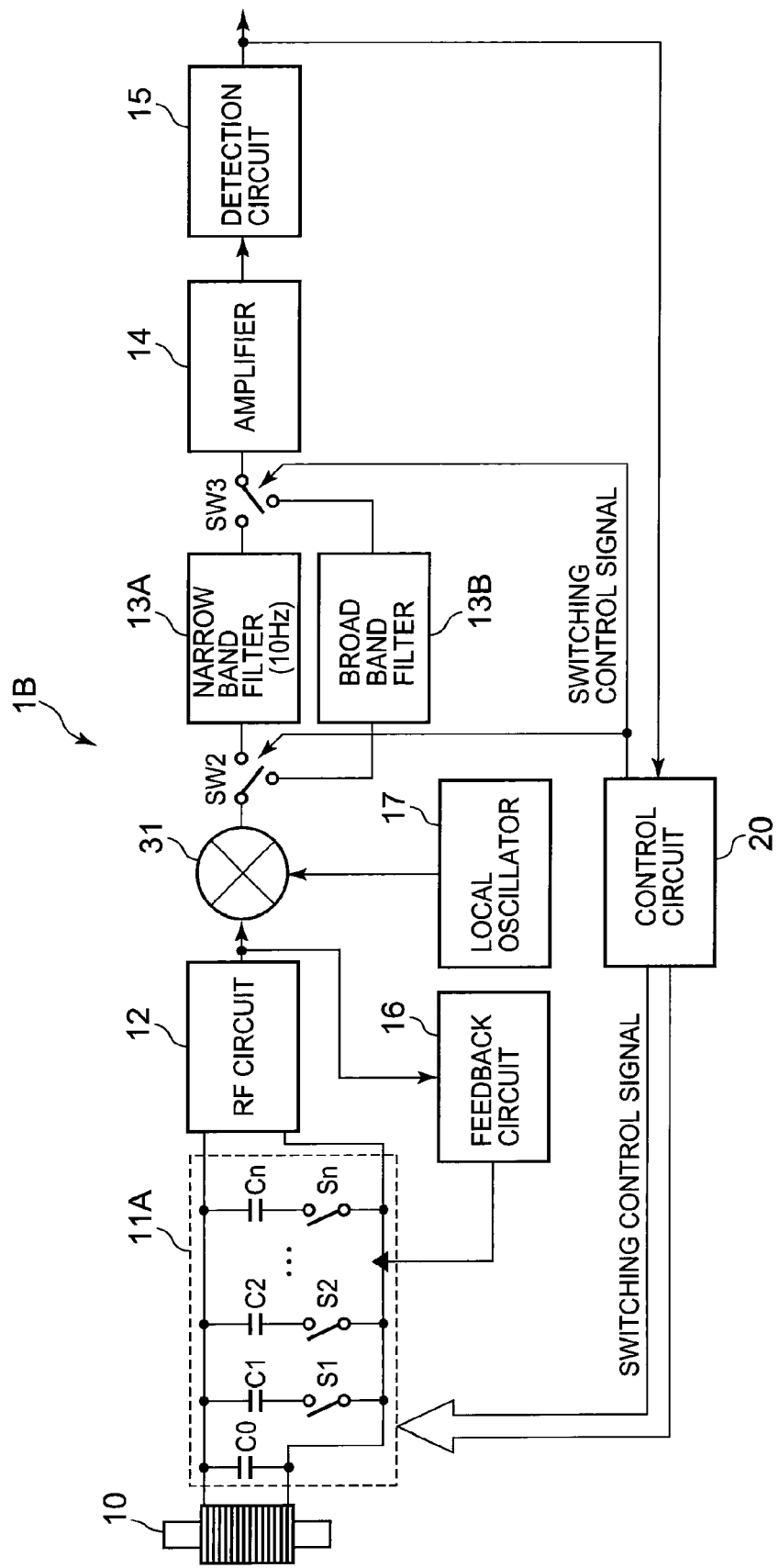
FIG. 8 is a diagram showing the overall construction of a radio wave receiver according to a third embodiment of the present invention.
Figure 9:
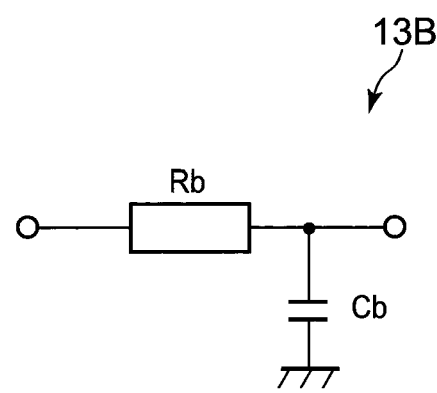
FIG. 9 is a circuit diagram showing a specific example of a broad band filter of FIG. 8.

FIG. 8 is a diagram showing the overall construction of a radio wave receiver 1B of the third embodiment. FIG. 9 is a circuit diagram showing an example of a broad band filter 13B.

In the radio wave receiver 13 according to a third embodiment, by applying a characteristic variation so as to spread the pass band width of the filter circuit for extracting the signal of the desired wave, the antenna adjusting processing can be performed even when the frequency of the oscillation signal is switched with skipping. The same constituent elements as the first and second embodiments are represented by the same reference numerals, and the detailed description thereof is omitted.

The radio wave receiver 1B of this embodiment is a super-heterodyne type radio wave receiver, and it has an antenna 10 for receiving a radio wave, a tuning circuit 11A for adjusting the frequency characteristic of the antenna 10, an RF circuit 12 for amplifying a reception signal and removing noise, a mixer 31 for converting a signal of a desired wave in the reception signal to a signal of a predetermined intermediate frequency, a narrow band filter 13A for extracting the signal of the intermediate frequency, an amplifier 14 for amplifying this extracted signal, a detection circuit 15 for demodulating the amplified signal, a feedback circuit 16 for generating an oscillation signal at the portion of the antenna 10 and the tuning circuit 11A, a local oscillator 17 for supplying a local oscillation signal to the mixer 31, a broad band filter 13B as an alternate filter which is switched in place of the narrow band filter 13A in the antenna adjusting processing, switches SW2 and SW3 as a switching unit for switching the narrow band filter 13A and the broad band filter 13B and a control circuit 20 for performing control processing such as the antenna adjusting processing, etc.

In the above construction, a reception processing section for extracting the signal of the desired wave and executing the signal processing is constructed by the mixer 31, the narrow band filter 13A, the amplifier 14 and the detection circuit 15, and a band width changing unit and a compensator for varying the frequency characteristic of the signal extraction of the reception processing section are constructed by the broad band filter 13B and the switches SW2 and SW3.

Not particularly limited, the narrow band filter 13A has a characteristic of passing a signal with a narrow band width of about 10 Hz in the intermediate frequency band which is set to several tens Hz.

The broad band filter 13B is a low pass filter comprising a resistor Rb and a capacitor Cb as shown in FIG. 9, for example, and it has a pass characteristic of a broad band which has an intermediate frequency and a band width of 100 Hz or more. In this embodiment, the intermediate frequency is a low frequency, and thus the low pass filter is applied as the broad band filter 13B. However, when the intermediate frequency is a relatively high frequency, a band pass filter of broad band may be applied.

According to the radio wave receiver 1B of this embodiment, when the antenna adjusting processing is executed, the control circuit 20 sets the feedback circuit 16 to an actuating state to generate the oscillation signal at the portion of the antenna 10 and the tuning circuit 11A. Furthermore, the control circuit 20 outputs a switching control signal for the switches SW2 and SW3 to switch the signal passage of the reception signal to the broad band filter 13B side.

Under this state, the control circuit 20 switches the setting of the tuning circuit 11A to discretely change the resonance frequency of the antenna 10. At this time, the oscillation signal generated at the same frequency as the resonance frequency of the antenna 10 is shifted by the amount corresponding to the local frequency in the mixer 31, and then sent to the broad band filter 13B. Here, when the frequency of the oscillation signal is greatly deviated from the frequency of the desired wave, it is greatly attenuated in the broad band filter 13B. However, when the frequency of the oscillation signal is slightly deviated from the frequency of the desired wave, it passes through the broad band filter 13B.

That is, as shown in FIG. 4, even when the oscillation signal discretely shifts its frequency like fn, fn+1, fn+2, fn+3, fn+4, etc. and is hardly overlapped with the pass band of the reception circuit (into which the pass band of the filter 13A is converted as the pass band for the signal before the frequency conversion), these oscillation signals are sent to the broad band filter 13B after the frequency conversion. Therefore, for example when the frequency of the oscillation signal is shifted to the frequency fn+1 of FIG. 4, the oscillation signal passes through the filter 13B and detected as the level increase of the demodulated output by the control circuit 20.

On the basis of the detection of the level increase of the demodulated output, the control circuit 20 can determine the proper setting state of the tuning circuit 11A at the reception time of the radio wave.

Furthermore, in the reception processing, the control circuit 20 switches the switch SW2, SW3 to switch the signal path of the reception signal to the narrow band filter 13A side. furthermore, the control circuit 20 switches the setting of the tuning circuit 11A to the proper setting state determined through the antenna adjusting processing. The reception processing is executed under this state, whereby the signal of the desired wave can be received with high reception sensitivity.

As described above, according to the radio wave receiver 1B of this embodiment, the narrow band filter 13A and the broad band filter 13B are switched to each other, whereby even in a case where the frequency of the oscillation signal is switched with skipping by the tuning circuit 11A, the oscillation signal passes through the broad band filter 13B when the frequency of the oscillation signal approaches to the frequency of the desired wave, and detected as the level increase of the demodulated output. Accordingly, the setting of the tuning circuit 11A which make the resonance frequency of the antenna approach to the frequency of the desired wave can be determined.

Furthermore, according to this embodiment, the alternative broad band filter 13B is used and the signal path is switched to the broad band filter 13B side so that the pass band of the reception circuit is spread. Therefore, the pass band characteristic can be surely changed by the simple circuit construction.

In the radio wave receiver 1B of the third embodiment, the signal path is switched between the narrow band filter 13A side and the broad band filter 13B side. However, a construction that the broad band filter 13B can be connected to the narrow band filter 13A in parallel and disconnected from the narrow band filter 13A may be applied. Furthermore, a construction that one filter circuit is provided and a circuit constant of the filter circuit is switched to switch the pass characteristic between narrow band and broad band may be applied.

Furthermore, the present invention is not limited to the first to third embodiments, and various modifications may be made. In the first to third embodiments, the control circuit 20 subjects the output level of the detection circuit 15 to AD conversion and detects whether the oscillation signal passes through the reception circuit. However, it may be detected whether the oscillation signal passes through the reception circuit on the basis of the level of an AGC (automatic gain control) signal for varying the signal value in accordance with the level of the demodulated output. Alternatively, the outputs of the filters 13, 13A (second embodiment), 13B (third embodiment) may be directly monitored to detect whether the oscillation signal passes through the reception circuit.

Furthermore, in the first embodiment, the tuning capacitance is continuously varied to vary the frequency of the oscillation signal along with time passage continuously. In place of this method, the same action can be obtained by adding the RF circuit with a constriction of distorting the signal and spreading the width of the frequency spectrum of the oscillation signal through this construction. The details of the embodiments may be properly changed without departing from the subject matter of the present invention.

What is claimed is:

1. A radio wave receiver comprising:
an antenna for receiving a radio wave;
a tuning unit that can discretely change a frequency characteristic of the antenna;
a positive feedback section for performing a feedback operation to apply positive feedback to a signal path including the tuning unit so as to oscillate the antenna and a circuit portion of the tuning unit;
a switch element for turning on and off the feedback operation performed by the positive feedback section;
a reception processing section for extracting a signal of a desired wave out of a reception signal received from the antenna in a state in which the feedback operation performed by the positive feedback section is off;
a controller for generating an oscillation signal at the circuit portion by the positive feedback section in a state in which the feedback operation performed by the positive feedback section is on, and switching a setting of the tuning unit to search for a setting state of the tuning unit in which the oscillation signal is extracted by the reception processing section; and
a compensator for applying a variation to a frequency characteristic of the oscillation signal or a frequency characteristic associated with the signal extraction of the reception processing section when the controller searches for the setting state.

2. The radio wave receiver according to claim 1, wherein the compensator has a variable reactance that is connected to the antenna and can continuously change the frequency characteristic of the antenna, and a characteristic changing unit for continuously changing a reactance value of the variable reactance.

3. The radio wave receiver according to claim 2, wherein the variable reactance is a varicap diode, and the characteristic changing unit is a signal generator for repetitively outputting a continuously-varying control voltage to the varicap diode.

4. The radio wave receiver according to claim 1, wherein the reception processing section comprises a frequency converter for converting a frequency of the reception signal received from the antenna, and a band-pass filter for extracting a signal having a frequency converted by the frequency converter from a frequency of the desired wave, wherein the compensator applies a variation to a frequency conversion amount of the frequency converter.

5. The radio wave receiver according to claim 4, wherein the frequency converter is a mixer for mixing the reception signal and a local oscillation signal to vary the frequency of the reception signal, and the compensator comprises a frequency-variable local oscillator for supplying the local oscillation signal to the mixer, and a signal generator for repetitively outputting a control signal for continuously varying a frequency of the local oscillation signal.

6. The radio wave receiver according to claim 1, wherein the reception processing section has a band-pass filter for extracting the signal of the desired wave, and the compensator is a band width changing unit for spreading a pass band of the band-pass filter.

7. The radio wave receiver according to claim 6, wherein the band width changing unit comprises an alternate filter having a broader pass band than the band-pass filter, and a switching unit that can switch between the band-pass filter and the alternate filter or connect the band-pass filter and the alternate filter in parallel.

* * * * *